US011501975B2

(12) United States Patent
Nishide et al.

(10) Patent No.: US 11,501,975 B2
(45) Date of Patent: Nov. 15, 2022

(54) SUBSTRATE PROCESSING METHOD AND SUBSTRATE PROCESSING APPARATUS (71) Applicant: TOKYO ELECTRON LIMITED, Tokyo (JP)

(72) Inventors: Daisuke Nishide, Miyagi (JP); Takayuki Katsunuma, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 11 days.

(21) Appl. No.: 17/133,974

(22) Filed: Dec. 24, 2020

(65) Prior Publication Data
US 2021/0202262 A1 Jul. 1, 2021

(30) Foreign Application Priority Data

Dec. 25, 2019 (JP) .............................. JP2019-233668

(51) Int. Cl.
*H01L 21/311* (2006.01)
*H01J 37/32* (2006.01)
*H01L 21/67* (2006.01)

(52) U.S. Cl.
CPC .. *H01L 21/31116* (2013.01); *H01J 37/32715* (2013.01); *H01L 21/31144* (2013.01); *H01L 21/67069* (2013.01); *H01J 2237/332* (2013.01); *H01J 2237/334* (2013.01)

(58) Field of Classification Search
None
See application file for complete search history.

(56) References Cited

U.S. PATENT DOCUMENTS

| 6,569,774 | B1* | 5/2003 | Trapp | H01L 21/31116 257/E21.252 |
| 8,476,168 | B2* | 7/2013 | Graves-Abe | H01L 21/76898 257/E21.258 |
| 2007/0197041 | A1* | 8/2007 | Nakaya | H01J 37/3266 257/E21.252 |
| 2015/0079760 | A1* | 3/2015 | Lei | H01L 21/3081 438/462 |
| 2020/0411366 | A1* | 12/2020 | Shi | H01L 21/76816 |
| 2022/0076962 | A1* | 3/2022 | Tan | H01L 21/02274 |

FOREIGN PATENT DOCUMENTS

JP 2018-098480 A 6/2018

* cited by examiner

Primary Examiner — Shamim Ahmed
(74) Attorney, Agent, or Firm — Weihrouch IP (57) ABSTRACT A substrate processing method includes a providing step, a forming step, and an etching step. In the providing step, a substrate including an etching target film, a first mask formed on the etching target film, and a second mask formed to cover at least a part of the first mask is provided. In the forming step, a protective film is formed on a side wall of the second mask by plasma generated from a first gas. In the etching step, the etching target film is etched with plasma generated from a second gas.

17 Claims, 10 Drawing Sheets

SUBSTRATE PROCESSING METHOD AND SUBSTRATE PROCESSING APPARATUS

CROSS-REFERENCE TO RELATED APPLICATION

This application is based on and claims priority from Japanese Patent Application No. 2019-233668 filed on Dec. 25, 2019 with the Japan Patent Office, the disclosure of which is incorporated herein in its entirety by reference.

TECHNICAL FIELD

The present disclosure relates to a substrate processing method and a substrate processing apparatus.

BACKGROUND

In the related art, an interlayer insulating film is selectively etched by using a laminated mask. Further, as a selective etching, for example, there is a technique of selectively etching a region of silicon nitride with respect to a region of silicon oxide. See, for example, Japanese Patent Laid-Open Publication No. 2018-098480.

SUMMARY

A substrate processing method according to an aspect of the present disclosure includes a providing step, a forming step, and an etching step. In the providing step, a substrate including an etching target film, a first mask formed on the etching target film, and a second mask formed to cover at least a part of the first mask is provided. In the forming step, a protective film is formed on a side wall of the second mask by plasma generated from a first gas. In the etching step, the etching target film is etched with plasma generated from a second gas The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of a substrate processing method and a substrate processing apparatus disclosed herein will be described in detail with reference to the drawings. Further, the present disclosure is not limited to the following embodiments.

In the related art, an interlayer insulating film is selectively etched by using a laminated mask. For example, when creating a pattern for forming a multi-layer wiring, there is a technique of advancing the processing of an etching target film (interlayer insulating film) while forming a thin CF (fluorocarbon) film on the mask surface using a CF-containing gas. However, it is difficult to form a CF film in the deep part of the laminated mask, the protection of the mask becomes insufficient, resulting in mask loss, and a sufficient selection ratio may not be obtained. Further, in a case where the mask protection is insufficient only by the etching process, combining with the film forming process of the protective film is performed. However, the blockage of the pattern and the film formation on the surface of the etching target film occur by introducing the film forming process. In this case, a phenomenon (etch stop) in which etching is stopped before the etching target film is processed into a desired shape has occurred. Therefore, it is expected to suppress mask loss in the laminated masks without generating an etch stop.

[Configuration of Plasma Processing System 1]

Figure 1:
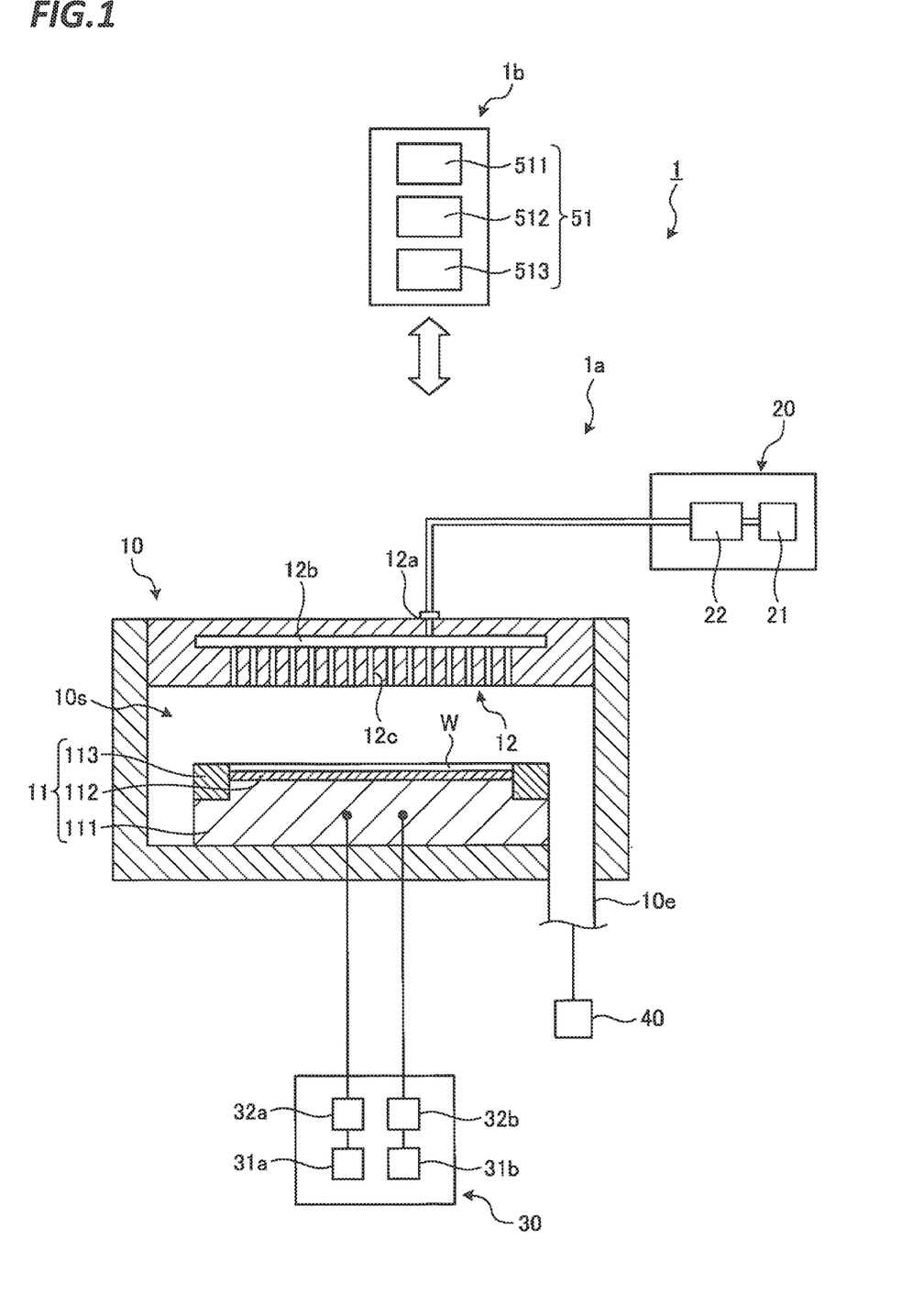
FIG. 1 is a diagram illustrating an example of a plasma processing system according to an embodiment of the present disclosure.

FIG. 1 is a diagram illustrating an example of a plasma processing system according to an embodiment of the present disclosure. As illustrated in FIG. 1, according to an embodiment, the plasma processing system 1 includes a plasma processing apparatus 1a and a controller 1b. The plasma processing apparatus 1a includes a plasma processing chamber 10, a gas supply 20, a radio frequency (RF) power supply 30, and an exhaust system 40. Further, the plasma processing apparatus 1a includes a support portion 11 and an upper electrode shower head 12. The support portion 11 is arranged in the lower region of a plasma processing space 10s in the plasma processing chamber 10. The upper electrode shower head 12 is located above the support portion 11 and may function as a part of the ceiling of the plasma processing chamber 10.

The support portion 11 is configured to support a substrate W in the plasma processing space 10s. In the embodiment, the support portion 11 includes a lower electrode 111, an electrostatic chuck 112, and an edge ring 113. The electrostatic chuck 112 is arranged on the lower electrode 111 and is configured support the substrate W on the upper surface of the electrostatic chuck 112. The edge ring 113 is arranged to surround the substrate W on the upper surface of a peripheral edge portion of the lower electrode 111. Further, although not illustrated, in the embodiment, the support portion 11 may include a temperature control module configured to adjust at least one of the electrostatic chuck 112 and the substrate W to a target temperature. The temperature control module may include a heater, a flow path, or a combination of these elements. A temperature control fluid such as a coolant or a heat transfer gas flows through the flow path.

The upper electrode shower head 12 is configured to supply one or more processing gases from the gas supply 20 to the plasma processing space 10s. In the embodiment, the upper electrode shower head 12 includes a gas inlet 12a, a gas diffusion chamber 12b, and a plurality of gas outlets 12c. The gas inlet 12a communicates fluidly with the gas supply 20 and the gas diffusion chamber 12b. The plurality of gas outlets 12c communicate fluidly with the gas diffusion chamber 12b and the plasma processing space 10s. In the embodiment, the upper electrode shower head 12 is configured to supply one or more processing gases from the gas inlet 12a to the plasma processing space 10s via the gas diffusion chamber 12b and the plurality of gas outlets 12c.

The gas supply 20 may include one or more gas sources 21 and one or more flow rate controllers 22. In the embodiment, the gas supply 20 is configured to supply one or more processing gases from the corresponding gas sources 21 to the gas inlet 12a via the corresponding flow rate controllers 22. Each flow rate controller 22 may include, for example, a mass flow controller or a pressure-controlled flow rate controller. Further, the gas supply 20 may include one or more flow rate modulation devices that modulate or pulse the flow rate of one or more processing gases.

The RF power supply 30 is configured to supply RF power, for example, one or more RF signals to one or more electrodes such as the lower electrode 111, the upper electrode shower head 12, or both the lower electrode 111 and the upper electrode shower head 12. As a result, plasma is generated from one or more processing gases supplied to the plasma processing space 10s. Therefore, the RF power supply 30 may function as at least a part of a plasma generator configured to generate plasma from one or more processing gases in the plasma processing chamber. In the embodiment, the RF power supply 30 includes two RF generators 31a and 31b and matching circuits 32a and 32b. In the embodiment, the RF power supply 30 is configured to supply a first RF signal from the first RF generator 31a to the lower electrode 111 via the first matching circuit 32a. For example, the first RF signal may have frequencies in the range of 27 MHz to 100 MHz.

In the embodiment, the RF power supply 30 is configured to supply a second RF signal from the second RF generator 31b to the lower electrode 111 via the second matching circuit 32b. For example, the second RF signal may have frequencies in the range of 400 kHz to 13.56 MHz. Instead, a direct current (DC) pulse generator may be used instead of the second RF generator 31b.

Further, although not illustrated, other embodiments may be considered in the present disclosure. For example, in an alternative embodiment, the RF power supply 30 may be configured to supply the first RF signal from the RF generator to the lower electrode 111, supply the second RF signal from the other RF generator to the lower electrode 111, and supply a third RF signal from yet another RF generator to the lower electrode 111. In addition, in other alternative embodiment, a DC voltage may be applied to the upper electrode shower head 12.

Further, in various embodiments, the amplitude of one or more RF signals (i.e., a first RF signal, a second RF signal, etc.) may be pulsed or modulated. Amplitude modulation may include pulsing the amplitude of the RF signal between the on and off states, or between two or more different on states.

The exhaust system 40 may be connected to, for example, an exhaust port 10e provided at the bottom of the plasma processing chamber 10. The exhaust system 40 may include a pressure valve and a vacuum pump. The vacuum pump may include a turbo molecular pump, a roughing pump, or a combination of these pumps.

In the embodiment, the controller 1b processes computer-executable instructions that cause the plasma processing apparatus 1a to perform the various steps described in the present disclosure. The controller 1b may be configured to control each element of the plasma processing apparatus 1a to perform the various steps described herein. In the embodiment, a part or entirety of the controller 1b may be included in the plasma processing apparatus 1a. The controller 1b may include, for example, a computer 51. The computer 51 may include, for example, a processing unit (CPU: central processing unit) 511, a storage unit 512, and a communication interface 513. The processing unit 511 may be configured to perform various control operations based on the program stored in the storage unit 512. The storage unit 512 may include a random access memory (RAM), a read only memory (ROM), a hard disk drive (HDD), a solid state drive (SSD), or a combination of these elements. The communication interface 513 may communicate with the plasma processing apparatus 1a via a communication line such as a local area network (LAN).

[Formation of Multi-Layer Wiring]

Figure 2:
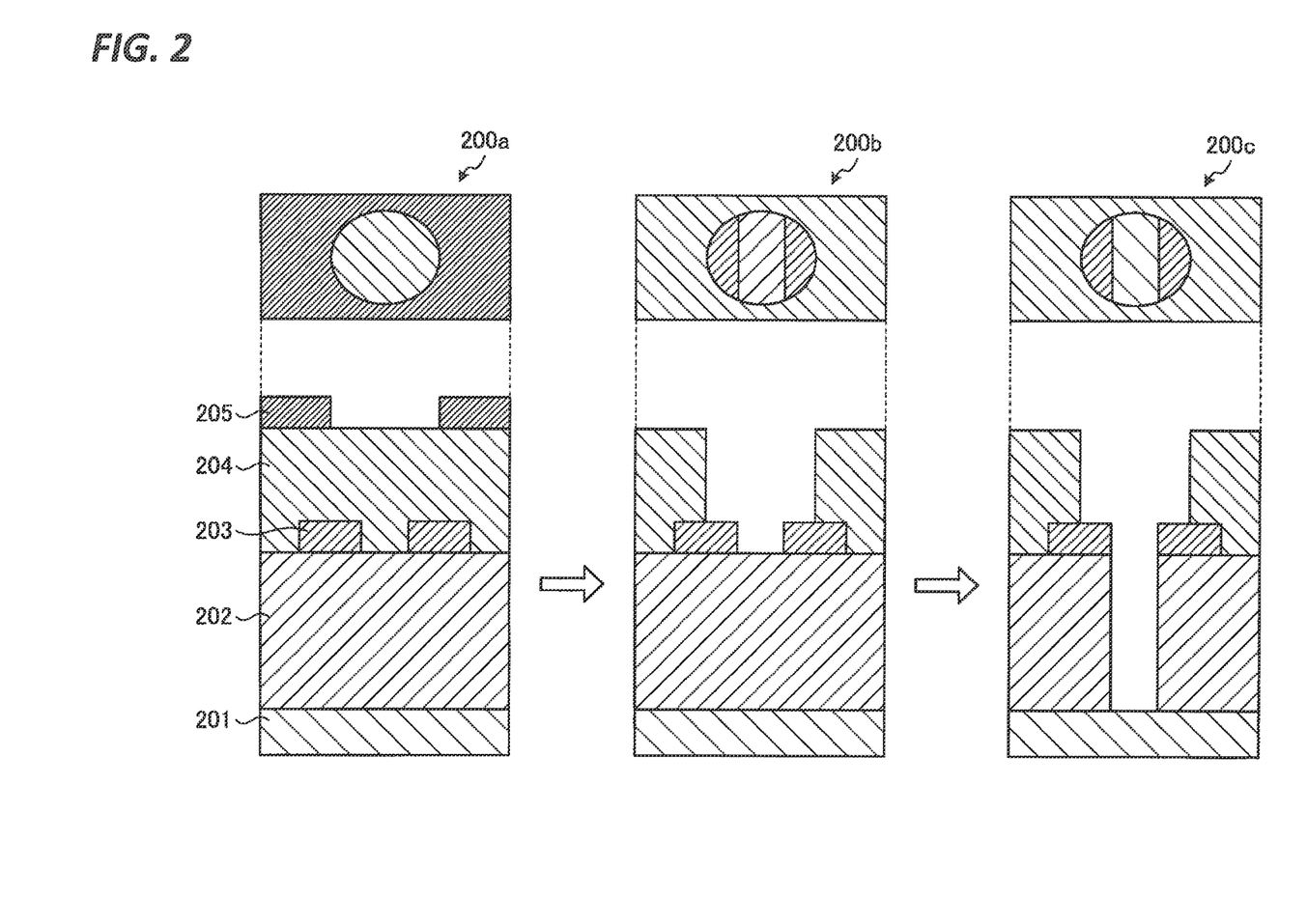
FIG. 2 is a diagram illustrating an example of forming a multi-layer wiring.

FIG. 2 is a diagram illustrating an example of forming a multi-layer wiring. As illustrated in a state 200a of FIG. 2, a substrate pattern 201, an interlayer insulating film 202, a trench mask 203, a via mask 204, and a resist film 205 are laminated on the substrate W on which the multi-layer wiring is formed. In FIG. 2, the substrate W is omitted. Further, in the following description, the first mask and the second mask may be expressed in the order of lamination on the interlayer insulating film 202 (etching target film). In the case of FIG. 2, the interlayer insulating film 202 is the etching target film, the trench mask 203 is the first mask, and the via mask 204 is the second mask.

In the multi-layer wiring process, the via mask 204 is first etched from the state 200a to a state 200b. Next, the interlayer insulating film 202 is etched from the state 200b to obtain a state 200c. Here, in the etching of the interlayer insulating film 202, the etching selectivity of two types of masks installed in different layers (i.e., the trench mask 203 and the via mask 204) is required. In the present embodiment, in order to implement such an etching selectivity, deposits (hereinafter, also referred to as a side deposition) are formed on the side wall of the via mask 204 (second mask).

Figure 3:
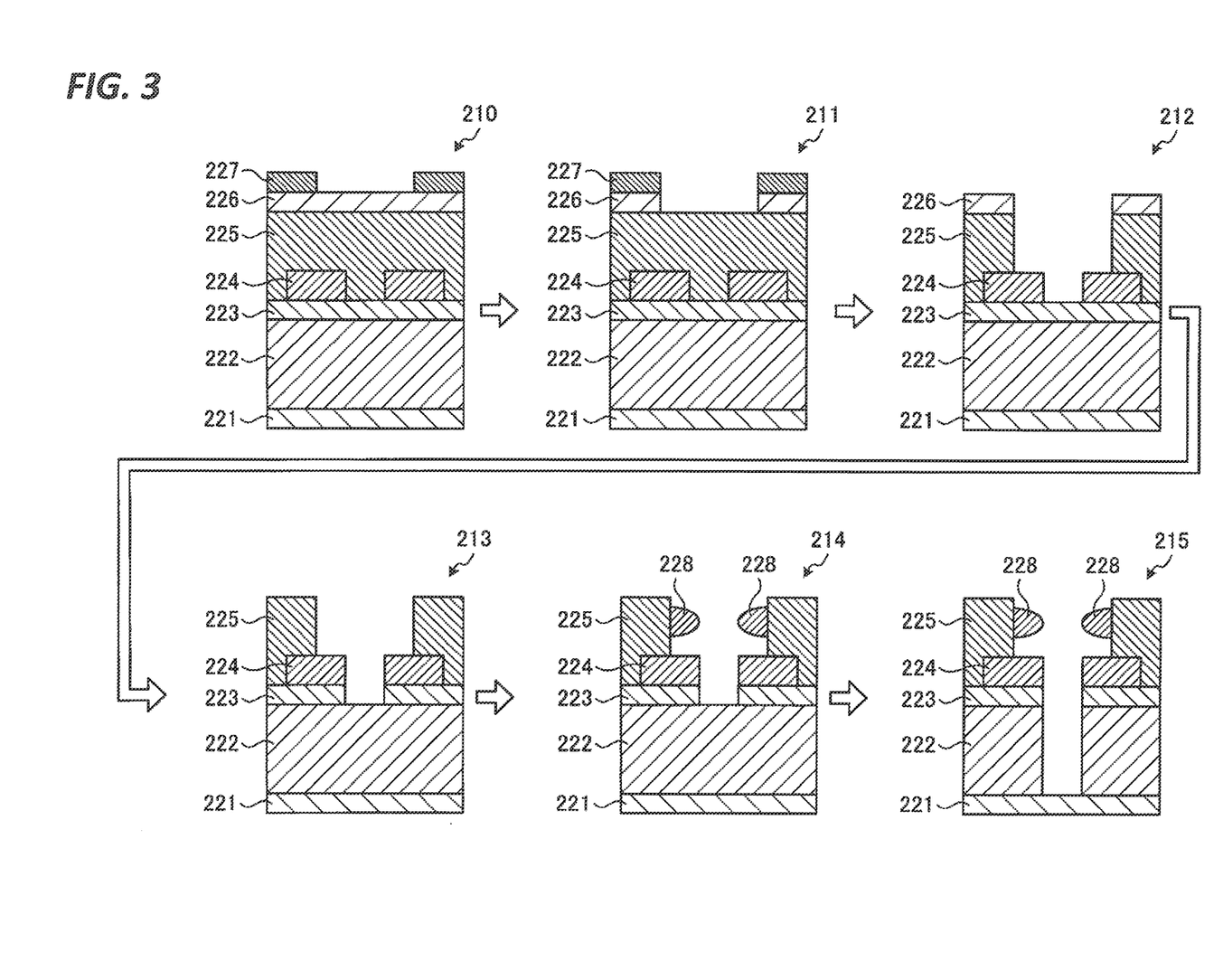
FIG. 3 is a diagram schematically illustrating an example of a process flow according to the present embodiment.

FIG. 3 is a diagram schematically illustrating an example of a process flow according to the present embodiment. As illustrated in FIG. 3, in the state 210, a substrate pattern 221, a first etching target film 222, a second etching target film 223, a first mask 224, a second mask 225, a SiARC film 226, and a resist film 227 are laminated on the substrate W. Further, in FIG. 3, the substrate W is omitted. To exemplify the first etching target film 222 to the second mask 225, examples of the first etching target film 222 and the second etching target film 223 may include a low-k film such as a SiOC film or a SiOCH film, or a $SiO_2$ film. Examples of the first mask 224 include a metal-containing film such as a TiN film or a WC film. Examples of the second mask 225 include a spin on carbon (SOC) film, which is an example of a carbon-containing film.

As a process flow, in the state 210, the SiARC film 226 is first etched by plasma generated from $CF_4$ gas to reach a state 211. Next, in the state 211, the second mask 225 and the resist film 227 are etched by plasma generated from $N_2$ gas and $H_2$ gas to reach a state 212. At this time, the second etching target film 223 and a part of the first mask 224 are exposed. Subsequently, in the state 212, the exposed second etching target film 223 and the SiARC film 226 are etched by plasma generated from $CF_4$ gas and $CHF_3$ gas to reach a state 213. Next, in the state 213, the side deposition 228 is formed on the side wall of the second mask 225 by the plasma generated from the first gas to reach a state 214. The first gas includes, for example, a hydrocarbon-containing gas and a nitrogen-containing gas, and specifically, a mixed gas of $C_3H_6$ gas and $N_2$ gas or a mixed gas of $CH_4$ gas and $N_2$ gas may be used. As for the first gas, an oxygen-containing gas such as $O_2$ or CO may be used together with the hydrocarbon gas and the nitrogen-containing gas, or instead of the nitrogen-containing gas. Further, as for the first gas, a gas containing silicon and fluorine such as a mixed gas of $SiH_4$ gas and $CF_4$ gas, or $SiF_4$ gas may be used. Subsequently, in the state 214, the first etching target film 222 is etched by the plasma generated from the second gas to reach a state 215. The second gas includes a fluorine-containing gas and a hydrogen-containing gas, and for example, a mixed gas of $CF_4$ gas and $H_2$ gas or a mixed gas of HF gas and $CH_4$ gas may be used. Thus, the mask loss of the first mask 224 and the second mask 225 may be suppressed.

<Substrate Processing Method>

Figure 4:
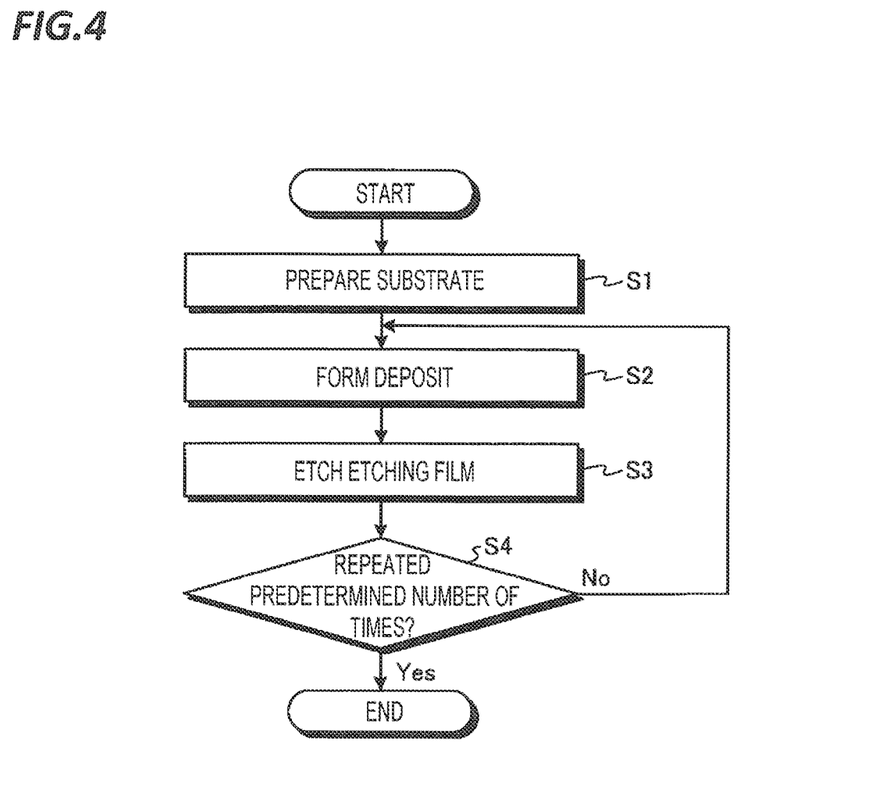
FIG. 4 is a flowchart illustrating an example of an etching process according to the present embodiment.

Next, a substrate processing method according to the present embodiment will be described. FIG. 4 is a flowchart illustrating an example of an etching process according to the present embodiment. The flowchart of FIG. 4 describes in detail the processing of the states 213 to 215 in the process flow of FIG. 3.

In the substrate processing method according to the present embodiment, the controller 1b opens an opening (not illustrated), and the substrate W in a state in which the etching target film (interlayer insulating film) may be etched (the state 213 in FIG. 3) is loaded into the plasma processing chamber 10, and the support portion 11 and is mounted on the electrostatic chuck 112 of the support portion 11 (stage). The substrate W is held by the electrostatic chuck 112 by applying a DC voltage to the electrostatic chuck 112. Thereafter, the controller 1b exhausts the gas from the plasma processing space 10s so that the atmosphere of the plasma processing space 10s becomes a predetermined degree of vacuum by closing the opening and controlling the exhaust system 40. Further, the controller 1b adjusts the temperature so that the temperature of the substrate W is included in a predetermined temperature range by controlling a temperature control module (not illustrated) (step S1).

Next, the controller 1b supplies $C_3H_6$ gas and $N_2$ gas to the gas inlet 12a as the first gas. The first gas is supplied to the gas inlet 12a and then supplied to the gas diffusion chamber 12b and diffused. After being diffused in the gas diffusion chamber 12b, the first gas is supplied in a shower shape to the plasma processing space 10s of the plasma processing chamber 10 via the plurality of gas outlets 12c, and is filled in the plasma processing space 10s.

The controller 1b supplies the RF signal for plasma excitation to the lower electrode 111 by controlling the RF power supply 30. That is, the RF signal, which is radio-frequency power, is applied to the lower portion. Plasma is generated in the plasma processing space 10s by supplying the RF signal to the lower electrode 111. At this time, self-bias is applied to the plasma, resulting in inverse anisotropic chemical vapor deposition (CVD), and deposits (side deposition 228) are formed on the side wall of the second mask 225 of the substrate W (step S2).

Figure 5:
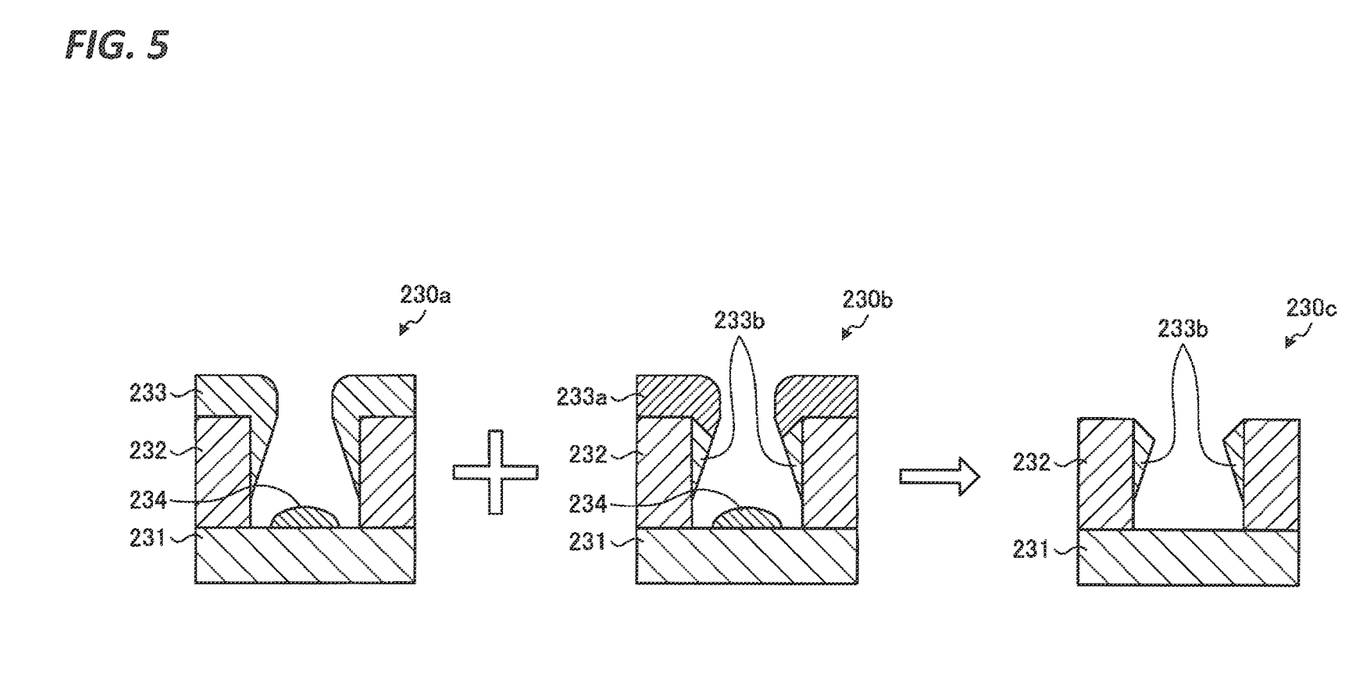
FIG. 5 is a diagram schematically illustrating an example of forming a side deposition according to the present embodiment.

Here, the formation of the side deposition will be described with reference to FIG. 5. FIG. 5 is a diagram schematically illustrating an example of forming a side deposition according to the present embodiment. In FIG. 5, the first mask (corresponding to the first mask 224 in FIG. 3) is omitted. In a state 230a of FIG. 5, a deposition 234 is formed on the etching target film 231 (corresponding to the first etching target film 222 in FIG. 3) by the plasma of the $C_3H_6$ gas generated by supplying the RF signal to the lower electrode 111 (the RF signal is applied to the lower portion thereof). Further, in the state 230a, a deposition 233 is formed on the mask 232 (corresponding to the second mask 225 in FIG. 3). Depositions 233 and 234 are formed by the anisotropic supply of ions and the isotropic polymerization of plasma CVD. In particular, in the deposition 233, when the RF signal is applied to the lower portion, a deposition having an extended hem is formed on the side wall of the mask 232.

Further, in a state 230b of FIG. 5, the depositions 233 and 234 are etched by the plasma of the $N_2$ gas generated by applying RF signal to the lower portion. By the anisotropy removal by N ions, a deposition 233a on the upper surface of the mask 232 is removed, but a side deposition 233b on the side wall of the mask 232 is not removed. The deposition 234 is removed by the anisotropy removal with N ions.

As described above, in step S2, when a gas having a film forming component such as $C_3H_6$ and a gas having a removing component such as $N_2$ are simultaneously supplied to generate plasma, the formation of the deposition and the removal of the deposition proceed at the same time. That is, the state 230a and the state 230b proceed at the same time. As a result, as represented in a state 230c, the side deposition 233b (corresponding to the side deposition 228 in FIG. 3) is formed on the side wall of the mask 232. That is, the side deposition 233b may be implemented by combining the essential isotropic film formation of plasma CVD, the anisotropic supply of ions by applying the RF signal to the lower portion, and the anisotropic removal of carbon by N. Further, step S2 may adopt other methods as long as the side deposition 233b as represented in the state 230c may be formed. For example, the side deposition 233b may be formed on the side wall of the mask 232 by sequentially performing a step of generating plasma from a gas having a film forming component to form a deposition and a step of generating plasma from a gas having a removing component to remove the deposition. In addition, the side deposition 233b may be formed on the side wall of the mask 232 by repeating the step of forming the deposition and the step of removing the deposition.

The description of FIG. 4 is referred to again. When the first gas is exhausted, the controller 1b supplies $CF_4$ gas and $H_2$ gas as the second gas to the gas inlet 12a. The second gas is supplied to the gas inlet 12a and then supplied to the gas diffusion chamber 12b and diffused. After being diffused in the gas diffusion chamber 12b, the second gas is supplied in a shower shape to the plasma processing space 10s of the plasma processing chamber 10 via the plurality of gas outlets 12c, and is filled in the plasma processing space 10s.

The controller 1b supplies the RF signal for plasma excitation to the lower electrode 111 by controlling the RF power supply 30. That is, the RF signal is applied to the lower portion. Plasma is generated in the plasma processing space 10s by supplying the RF signal to the lower electrode 111. In the plasma processing space 10s, the first etching target film 222 of the substrate W is etched by the plasma of the second gas (step S3).

Figure 6:
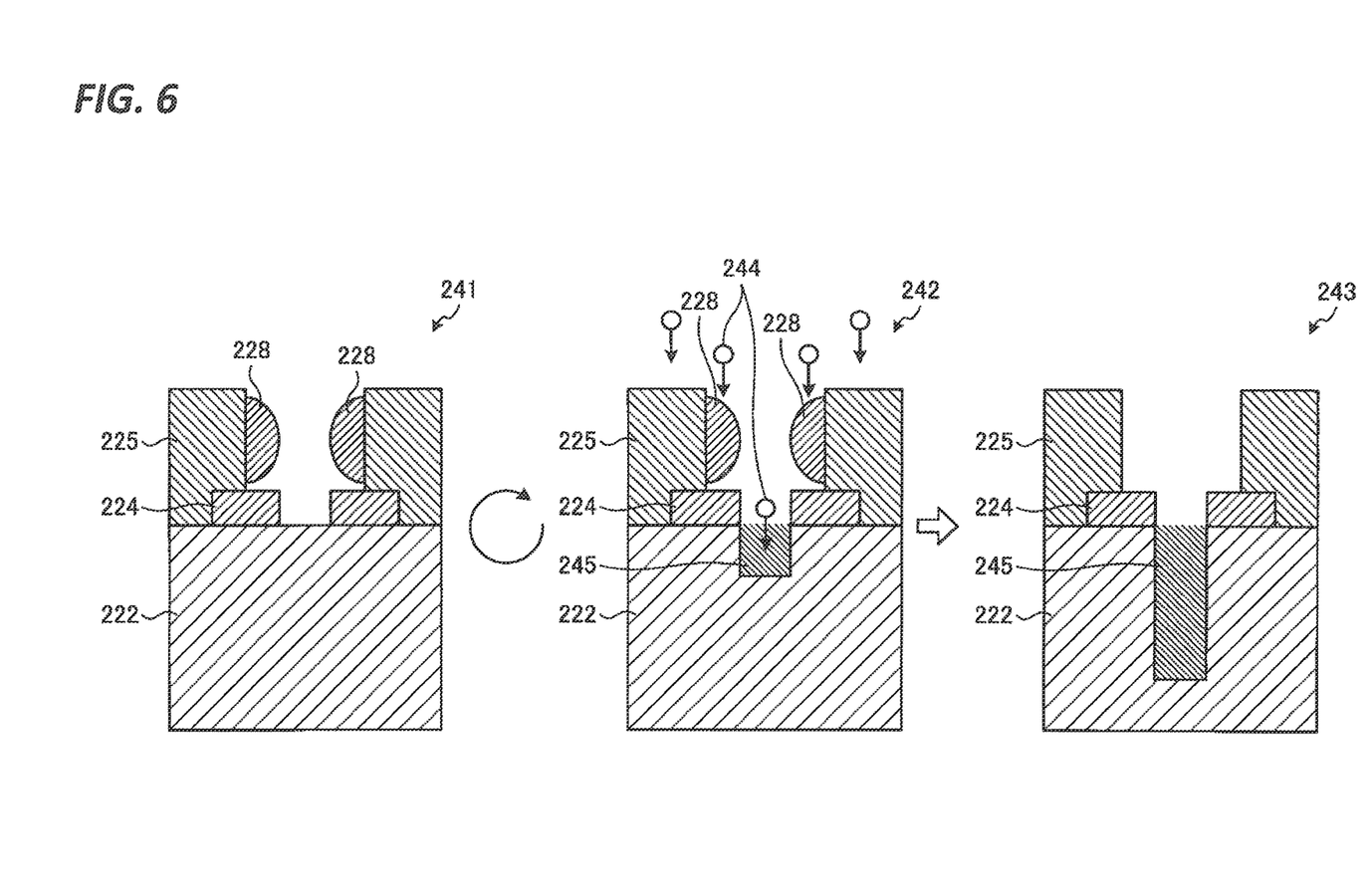
FIG. 6 is a diagram schematically illustrating an example of repeating a side deposition and etching according to the present embodiment.

Here, the repetition of the side deposition and the etching will be described with reference to FIG. 6. FIG. 6 is a diagram schematically illustrating an example of repeating the side deposition and etching according to the present embodiment. Further, in FIG. 6, the substrate W, the substrate pattern 221, and the second etching target film 223 are omitted. A state 241 of FIG. 6 corresponds to the state 213 of FIG. 3, and a side deposition 228 is formed on the side wall of the second mask 225. In a state 242 of FIG. 6, the first etching target film 222 is etched by the plasma generated from the $CF_4$ gas and $H_2$ gas. At this time, ions 244 etch the first etching target film 222 to form a trench 245. Meanwhile, the ions 244 do not collide with the first mask 224 due to the presence of the side deposition 228, and the first mask 224 is not etched. In the state 242, when the side deposition 228 is consumed by etching, the formation of the side deposition 228 in the state 241 is started again. That is, the formation of the side deposition 228 in the state 241 and the etching of the first etching target film 222 in the state 242 are repeated until the trench 245 reaches a state 243 having a desired depth. Further, the predetermined number of repetitions may be obtained, for example, by experiment in advance.

The description of FIG. 4 is referred to again. The controller 1b determines whether the deposit forming step and the etching step have been repeated a predetermined number of times (step S4). The predetermined number of times may be, for example, three times. When the controller 1b determines that the process has not been repeated a predetermined number of times ("No" in step S4), the controller 1b returns the process to step S2. Meanwhile, when the controller 1b determines that the process has not been repeated a predetermined number of times ("Yes" in step S4), the process ends. In step S4, the controller 1b may determine whether a predetermined shape of the etching target film has been obtained.

When the process is ended, the controller 1b stops the supply of the RF signal to the lower electrode 111 by controlling the RF power supply 30. Further, the controller 1b applies a DC voltage having opposite positive and negative directions to the electrostatic chuck 112 to eliminate static electricity, and the substrate W is peeled off from the electrostatic chuck 112. The controller 1b opens an opening (not illustrated). The substrate W is unloaded from the plasma processing space 10s of the plasma processing chamber 10 through the opening.

[Experimental Results]

Figure 7A:
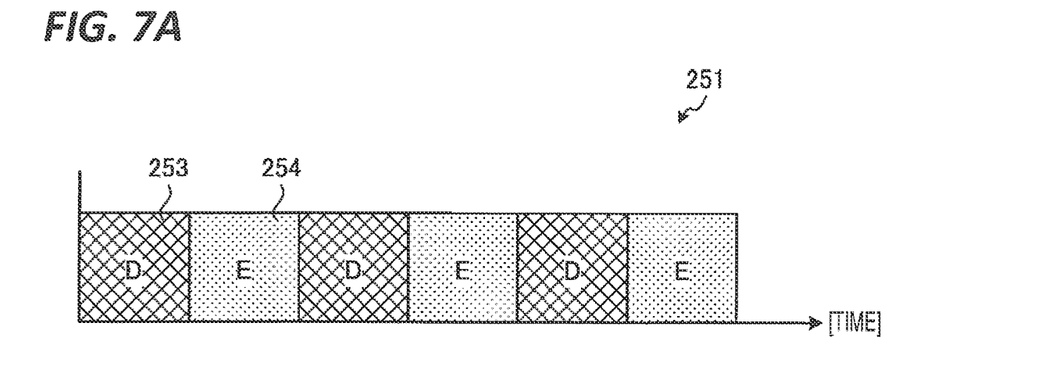
FIGS. 7A and 7B are diagrams illustrating an example representing the repetition of a side deposition and etching in the present embodiment and a comparative example on the time axis.
Figure 7B:
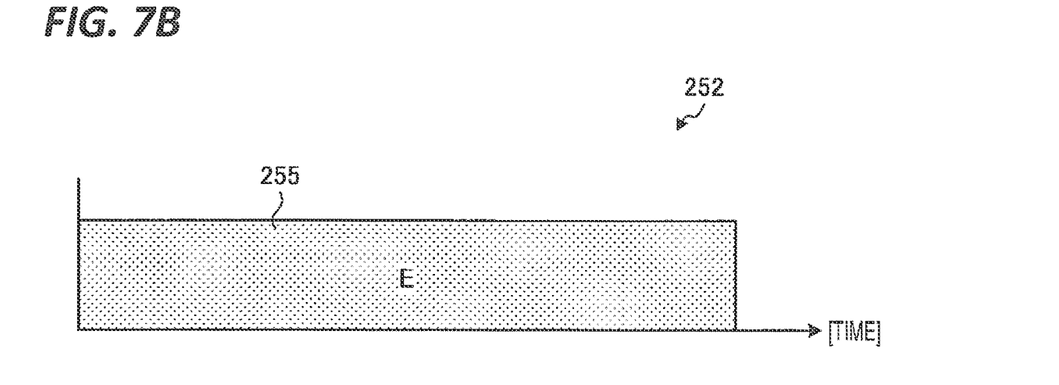

Subsequently, the experimental results will be described with reference to FIGS. 7A and 7B, and FIGS. 8 to 11. FIGS. 7A and 7B are diagrams illustrating an example representing the repetition of a side deposition and etching in the present embodiment and a comparative example on the time axis. As illustrated in a graph 251 of FIGS. 7A and 7B, in the present embodiment, the formation of a side deposition 253 ("D") and an etching 254 ("E") are repeated three times under the following processing conditions. Meanwhile, as illustrated in a graph 252, in the comparative example, an etching 255 ("E") is performed once under the following processing conditions.

Figure 8:
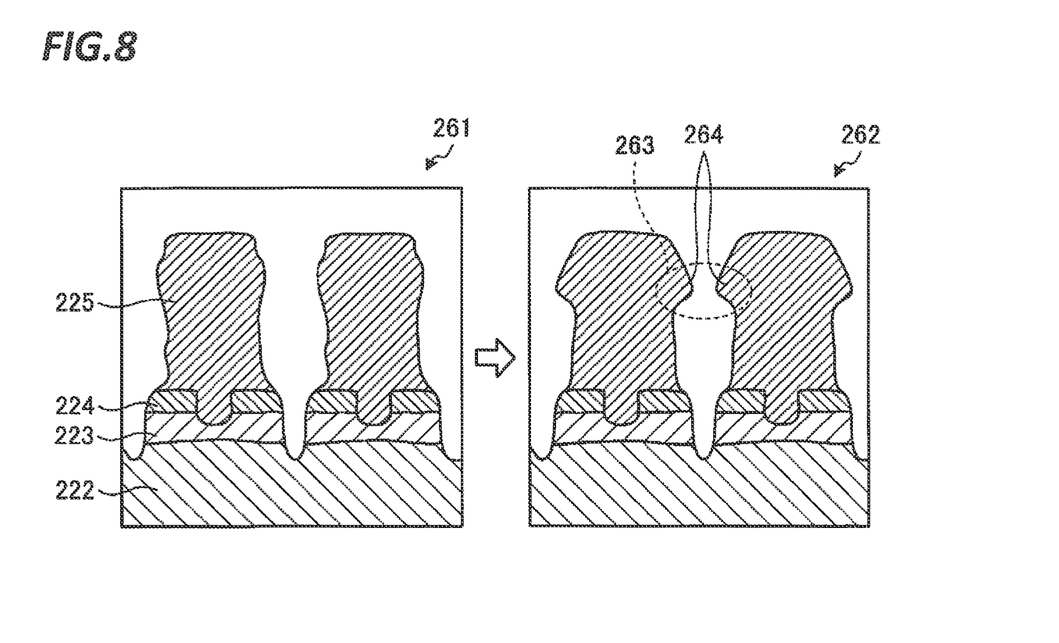
FIG. 8 is a diagram illustrating an example of a cross section before and after the side deposition in the present embodiment.

<Processing Conditions of Present Embodiment>
(Formation of Side Deposition)
Temperature: −70° C.
Pressure in plasma processing chamber 10: 30 mTorr
Power of RF signal: 300 W
Processing gas: $C_3H_6/N_2$=10/290 sccm
Processing time: 7 seconds
(Etching)
Temperature: −70° C.
Pressure in plasma processing chamber 10: 25 mTorr
Power of RF signal: 1400 W
Processing gas: $C_4H_2/N_2$=35/130 sccm
Processing time: 10 seconds
<Processing Conditions of Comparative Example>
(Etching)
Temperature: −70° C.
Pressure in plasma processing chamber 10: 25 mTorr
Power of RF signal: 1400 W
Processing gas: $C_4H_2/N_2$=35/130 sccm
Processing time: 10 seconds, 20 seconds, 30 seconds FIG. 8 is a diagram illustrating an example of a cross section before and after the side deposition in the present embodiment. A cross section 261 illustrated in FIG. 8 represents a state before the formation of the side deposition in the present embodiment. The cross section 261 represents the state before the second etching target film 223, the first mask 224, and the second mask 225 are etched, and the first etching target film 222 is etched. A cross section 262 represents the state after the formation of the side deposition in the present embodiment. In the cross section 262, it may be seen that the side deposition 264 is formed in the side wall region 263 of the second mask 225.

Figure 9:
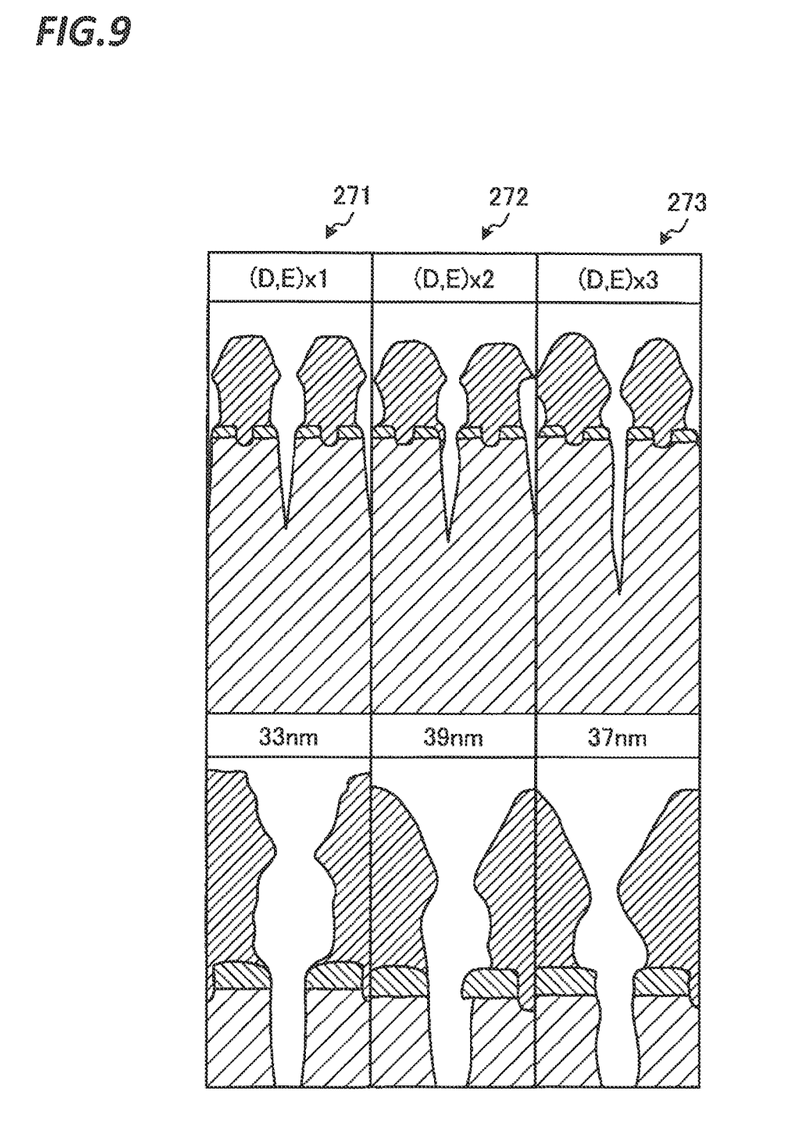
FIG. 9 is a diagram illustrating an example of experimental results in the present embodiment.

FIG. 9 is a diagram illustrating an example of experimental results in the present embodiment. The experimental results 271 to 273 illustrated in FIG. 9 are the results when the above steps S2 and S3 are repeated 1 to 3 times, respectively. The middle stages of the experimental results 271 to 273 are indicated as the values of critical dimension (CD), which are 33 nm, 39 nm, and 37 nm, respectively. Further, the lower stages of the experimental results 271 to 273 are the enlargement of the vicinity of the second mask 225.

Figure 10:
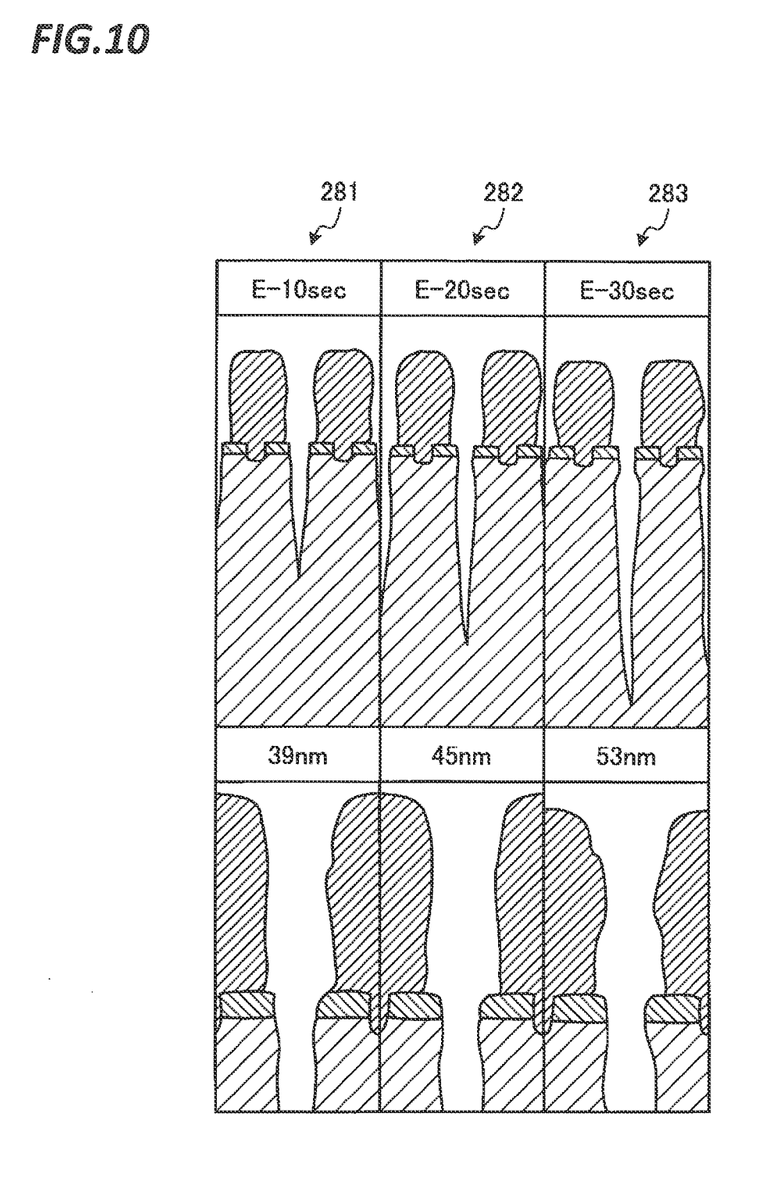
FIG. 10 is a diagram illustrating an example of experimental results in the comparative example.

FIG. 10 is a diagram illustrating an example of experimental results in the comparative example. The experimental results 281 to 283 illustrated in FIG. 10 are the results obtained when the processing times are set to 10 seconds, 20 seconds, and 30 seconds, respectively, under the processing conditions of the comparative example. The middle stages of the experimental results 281 to 283 are the values of CD, which are 39 nm, 45 nm, and 53 nm, respectively. Further, the lower stages of the experimental results 281 to 283 are the enlargement of the vicinity of the second mask 225.

When the experimental results 271 to 273 in FIG. 9 are compared with the experimental results 281 to 283 in FIG. 10, it may be seen that the loss of the first mask 224 (TiN) does not occur in the experimental results 271 to 273. Further, when the values of CD are compared, it may be seen that bowing is suppressed in the experimental results 271 to 273. Further, when the experimental result 271 and the experimental result 281 are compared with each other, it may be seen that the difference in CD has already occurred even at the initial stage of the etching reaction.

Figure 11:
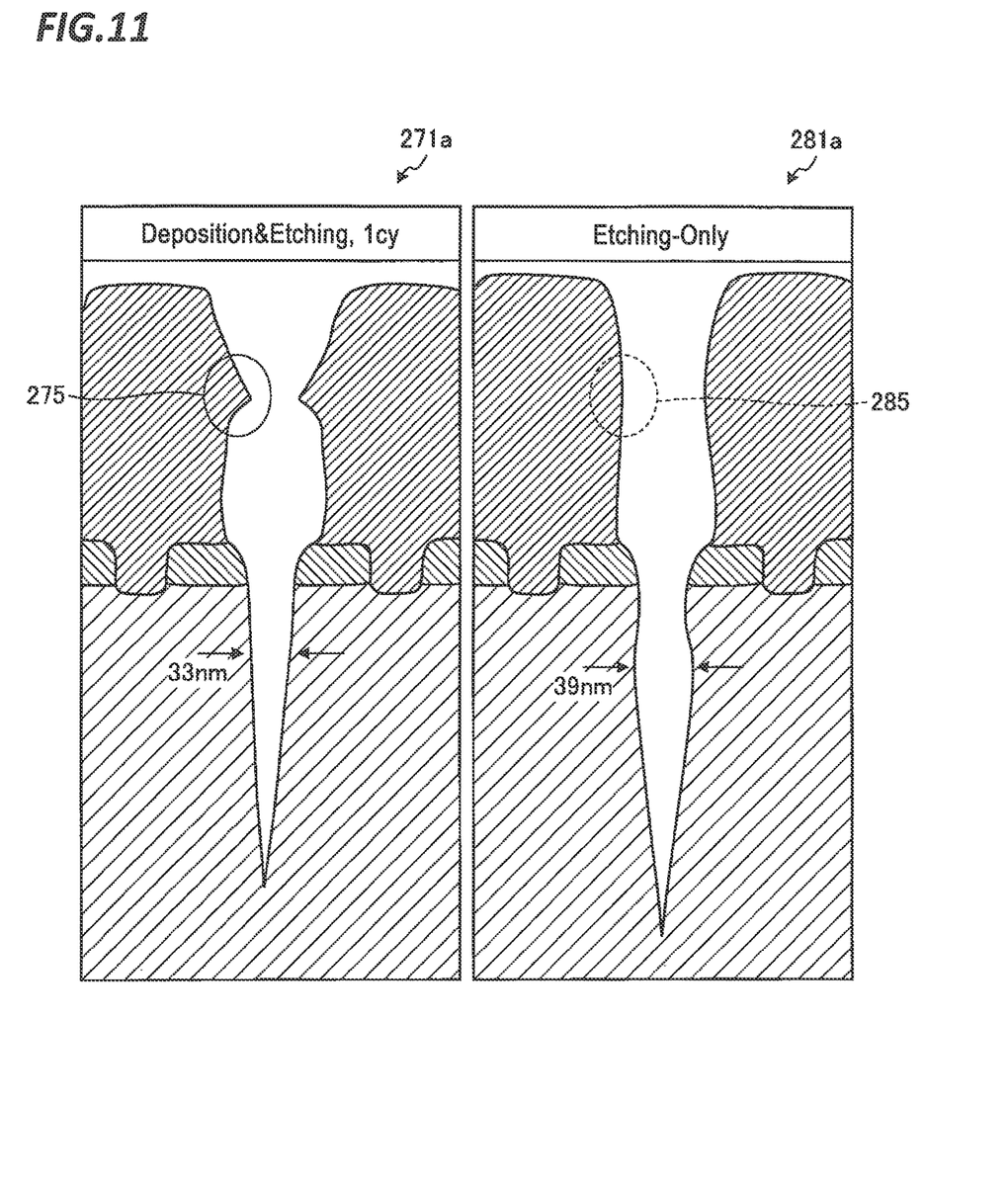
FIG. 11 is a diagram illustrating an example of a comparison of bowing with and without side deposition.

FIG. 11 is a diagram illustrating an example of comparison of bowing in the presence or absence of a side deposition. An experimental result 271a illustrated in FIG. 11 is an enlargement of the experimental result 271 illustrated in FIG. 9. Also, an experimental result 281a illustrated in FIG.

11 is an enlargement of the experimental result 281 illustrated in FIG. 10. In the experimental result 271*a*, the side deposition 275 may be confirmed, and the CD is 33 nm. Meanwhile, in the experimental result 281*a*, there is no side deposition in a region 285 which is the side wall of the second mask 225, and the CD is 39 nm. This suggests that bowing, which is an enlargement of CD, is caused not only by the loss of the first mask 224 (TiN) but also by the oblique incidence of ions. That is, the formation of the side deposition has two effects: being able to suppress the enlargement of the CD by protecting the first mask 224; and being able to suppress bowing by narrowing the width of the pattern and taking only the vertically incident component.

In the above-described embodiment, the plasma processing system 1 includes the plasma processing apparatus 1*a* and the controller 1*b*, but may be configured as a substrate processing apparatus including the plasma processing apparatus 1*a* and the controller 1*b*.

As described above, according to the present embodiment, the substrate processing apparatus (plasma processing system 1) includes a stage (support portion 11) and a controller 1*b*. The stage places the substrate W including the first etching target film 222, the first mask 225 formed on the first etching target film 222, and the second mask 225 formed to cover at least a part of the first mask. The controller 1*b* performs a step of forming a protective film (side deposition 228) on the side wall of the second mask 225 by the plasma generated from the first gas, and a step of etching the first etching target film 222 by the plasma generated from the second gas. As a result, mask loss in the laminated masks may be suppressed. In addition, bowing may be suppressed.

Further, according to the present embodiment, the forming step includes a step of forming deposits on the upper surface and the side wall of the second mask 225, and the surface of the first etching target film 222, and a step of removing the deposits formed on the surface of the first etching target film 222 to form a protective film on the side wall of the second mask 225. As a result, the first mask 224 may be protected.

Further, according to the present embodiment, the protective film is formed by the plasma generated from the first gas by supplying RF power to the stage on which the substrate W is placed. As a result, a protective film may be formed on the side wall of the second mask 225.

Further, according to the present embodiment, a protective film is formed up to the position of the side wall of the first mask 224 on the upper portion of the first mask 224 that is not covered with the second mask 225. As a result, the first mask 224 may be protected.

In addition, according to the present embodiment, the first etching target film 222 is a low-k film or a $SiO_2$ film. As a result, etching may be performed while suppressing bowing.

Further, according to the present embodiment, the first mask 224 is a metal-containing film, and the second mask 225 is a carbon-containing film. As a result, mask loss in the laminated masks may be suppressed.

Further, according to the present embodiment, the first gas is a hydrocarbon- and nitrogen-containing gas, a hydrocarbon- and oxygen-containing gas, or a silicon- and fluorine-containing gas. As a result, a protective film containing carbon or silicon may be formed on the side wall of the second mask 225.

Further, according to the present embodiment, the second gas is a fluorine- and hydrogen-containing gas. As a result, the first etching target film 222 may be etched.

Further, according to the present embodiment, the forming step and the etching step are alternately repeated at least once or more. As a result, mask loss in the laminated masks may be further suppressed.

Further, according to the present embodiment, the forming step and the etching step are performed in the same processing container. As a result, the forming step and the etching step may be efficiently repeated.

Further, according to the present embodiment, the forming step and the etching step are performed in different processing containers. As a result, when processing is performed on a plurality of substrates W, each step may be efficiently performed.

For example, in the above-described embodiment, a substrate W provided with a two-tier mask including a first mask formed on the etching target film and a second mask formed to cover at least a part of the first mask is targeted for processing. However, the present disclosure is not limited to a substrate having such a two-tier mask, and a substrate having a multi-tier mask may also be targeted. Here, the substrate having the multi-tier mask means a substrate having a multi-tier mask that includes an etching target film, an nth mask of an nth tier (n is an integer of 1 or more) from the etching target film on the etching target film, and an (n+1)th mask which is a mask of an (n+1)th tier from the etching target film and is formed to cover at least a part of the nth mask.

A substrate having a multi-tier mask may also be processed in the same manner as in the above-described embodiment. Specifically, the substrate having the multi-tier mask is loaded into the plasma processing chamber 10 and held on the electrostatic chuck 112 provided on the stage (support portion 11). Subsequently, the plasma generated from the first gas forms a protective film on the side wall of any one or more masks other than the first mask formed on the etching target film. Thereafter, the etching target film is etched by the plasma generated from the second gas.

Also in the case of targeting a substrate having a multi-tier mask, as in the above-described embodiment, a protective film may be formed by forming deposits on the side walls of any one or more masks other than the first mask and on the surface of the etching target film, and then removing the deposits formed on the surface of the etching target film. Further, the protective film may be formed by the plasma generated from the first gas by supplying RF power to the stage on which the substrate is placed. Further, the protective film may be formed on the upper portion of the first mask up to the position of the side wall of the first mask.

As another method, it is conceivable to use an unsaturated atomic layer deposition (ALD) to form a film halfway through the trench. However, the unsaturated ALD is intended for those having a high aspect ratio (e.g., 5 or more), and when the unsaturated ALD is applied to a pattern for forming a multi-layer wiring having a low aspect ratio, a film is formed up to the bottom of the trench. Further, when it is intended to remove the film at the bottom of the trench, the film formed on the mask is also peeled off. In contrast, in the above-described embodiment, even when the pattern is intended to form a multi-layer wiring having a low aspect ratio, since a side deposition may be formed without forming a film on the bottom of the trench, a sufficient selection ratio may be obtained and the etching target film may be selectively etched.

Further, in the above-described embodiment, a hydrocarbon- and nitrogen-containing gas is used as the first gas, but the present disclosure is not limited thereto. For example, a silicon- and fluorine-containing gas, a metal element (Ti, W), and a chlorine-containing gas may be used depending on the material of the etching target film and the mask.

Further, in the above-described embodiment, the RF signal is applied to the lower portion, but when a bias component is included, a substrate processing apparatus to which the RF signal is applied to the upper portion may be used. The formation position of the side deposition may be adjusted by adjusting the bias.

According to the present disclosure, the loss of the laminated mask may be suppressed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
   providing a substrate including an etching target film, a first mask on etching target film, and a second mask that covers a part of the first mask, the first mask having a first opening width, and the second mask having a second opening width larger than the first opening width;
   forming a protective film on a side wall of the second mask by plasma generated from a first gas; and
   etching the etching target film with plasma generated from a second gas.

2. The substrate processing method according to claim 1, wherein the forming the protective film includes:
   forming a deposit on an upper surface and the side wall of the second mask and a surface of the etching target film; and
   removing the deposit formed on the surface of the etching target film.

3. The substrate processing method according to claim 2, wherein the protective film is formed by the plasma generated from the first gas by supplying RF power to a stage on which the substrate is placed.

4. The substrate processing method according to claim 3, wherein the protective film is formed on an upper portion of the first mask that is not covered with the second mask up to a position of the side wall of the first mask.

5. The substrate processing method according to claim 4, wherein the etching target film is a low-k film or a SiO2 film.

6. The substrate processing method according to claim 5, wherein the first mask is a metal-containing film and the second mask is a carbon-containing film.

7. The substrate processing method according to claim 6, wherein the first gas is a hydrocarbon- and nitrogen-containing gas, a hydrocarbon- and oxygen-containing gas, or a silicon- and fluorine-containing gas.

8. The substrate processing method according to claim 7, wherein the second gas is a fluorine- and hydrogen-containing gas.

9. The substrate processing method according to claim 8, wherein the forming the protective film and the etching the etching target film are alternately repeated at least once or more.

10. The substrate processing method according to claim 9, wherein the forming the protective film and the etching the etching target film are performed in a same processing chamber.

11. The substrate processing method according to claim 9, wherein the forming the protective film and the etching the etching target film are performed in different processing chambers.

12. The substrate processing method according to claim 1, wherein the providing the substrate further includes:
    providing a substrate including the etching target film, the first mask, a second mask that covers the first mask, and a third mask on the second mask, the third mask having the second opening width; and
    etching the second mask through the third mask to expose the etching target film.

13. The substrate processing method according to claim 2, wherein the forming a deposit and the removing the deposit are performed at the same time.

14. The substrate processing method according to claim 2, wherein the removing the deposit is performed after the forming a deposit.

15. The substrate processing method according to claim 2, wherein the forming a deposit and the removing the deposit are repeated.

16. The substrate processing method according to claim 6, wherein the first mask is a TiN film or a WC film.

17. A substrate processing method comprising:
    providing a substrate including an etching target film and a multi-tier mask formed on the etching target film, the multi-tier mask including an nth mask of an nth tier (n is an integer of 1 or more) from the etching target film and an (n+1)th mask which is a mask of an (n+1)th tier from the etching target film and covers a part of the nth mask, the nth mask having an nth opening width, the (n+1)th mask having an (n+1)th opening width larger than the nth opening width;
    forming a protective film on a side wall of any one or more masks other than the first mask among the multi-tier mask by plasma generated from a first gas; and
    etching the etching target film by plasma generated from a second gas.

* * * * *